US008866532B2

(12) United States Patent
De Wit

(10) Patent No.: US 8,866,532 B2
(45) Date of Patent: Oct. 21, 2014

(54) PASSIVE INTEGRATOR AND METHOD

(75) Inventor: Yannick De Wit, Aartselaar (BE)

(73) Assignee: Semiconductor Components Industries, LLC

( * ) Notice: Subject to any disclaimer, the term of this patent is extended or adjusted under 35 U.S.C. 154(b) by 0 days.

(21) Appl. No.: 13/437,683

(22) Filed: Apr. 2, 2012

(65) Prior Publication Data

US 2013/0257506 A1 Oct. 3, 2013

(51) Int. Cl.
*H03K 5/00* (2006.01)

(52) U.S. Cl.
USPC .......... 327/337; 327/554

(58) Field of Classification Search
USPC .......... 327/336-337, 551-559, 510-512
See application file for complete search history.

(56) References Cited

U.S. PATENT DOCUMENTS

| | | | | |
|---|---|---|---|---|
| 4,613,402 | A | 9/1986 | Losee et al. | |
| 5,268,576 | A * | 12/1993 | Dudley | 250/332 |
| 5,625,210 | A | 4/1997 | Lee et al. | |
| 5,880,495 | A | 3/1999 | Chen | |
| 5,904,493 | A | 5/1999 | Lee et al. | |
| 7,151,286 | B2 | 12/2006 | Roy | |
| 7,719,590 | B2 * | 5/2010 | Ellis-Monaghan et al. | 348/308 |
| 7,745,773 | B1 | 6/2010 | Merrill | |
| 2011/0303846 | A1 * | 12/2011 | Thorne | 250/332 |

* cited by examiner

*Primary Examiner* — Dinh Le
(74) *Attorney, Agent, or Firm* — Rennie William Dover

(57) ABSTRACT

In accordance with an embodiment, a passive integrator includes a charge storage element coupled between first and second transistors, wherein the first transistor has a current carrying electrode coupled for receiving a signal and a current carrying electrode coupled to the charge storage element. The second transistor has a current carrying electrode coupled to the charge storage element and a second current carrying electrode coupled to another charge storage element.

17 Claims, 10 Drawing Sheets

150

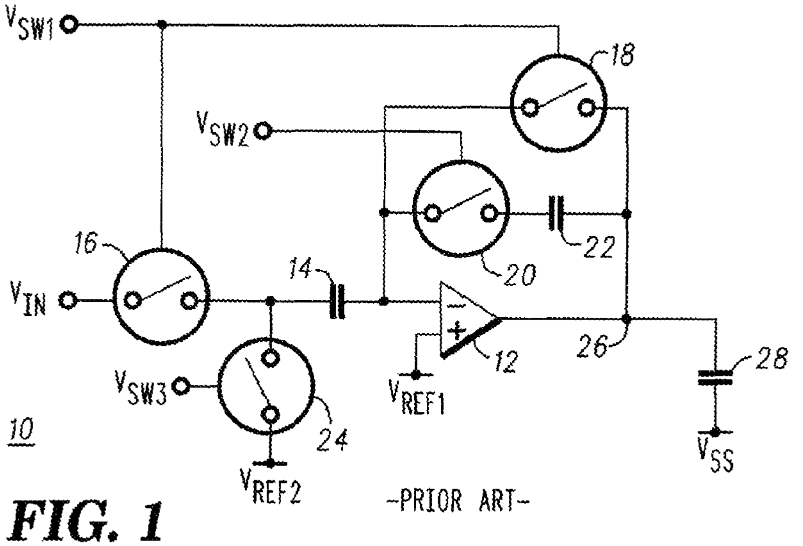
FIG. 1
FIG. 2
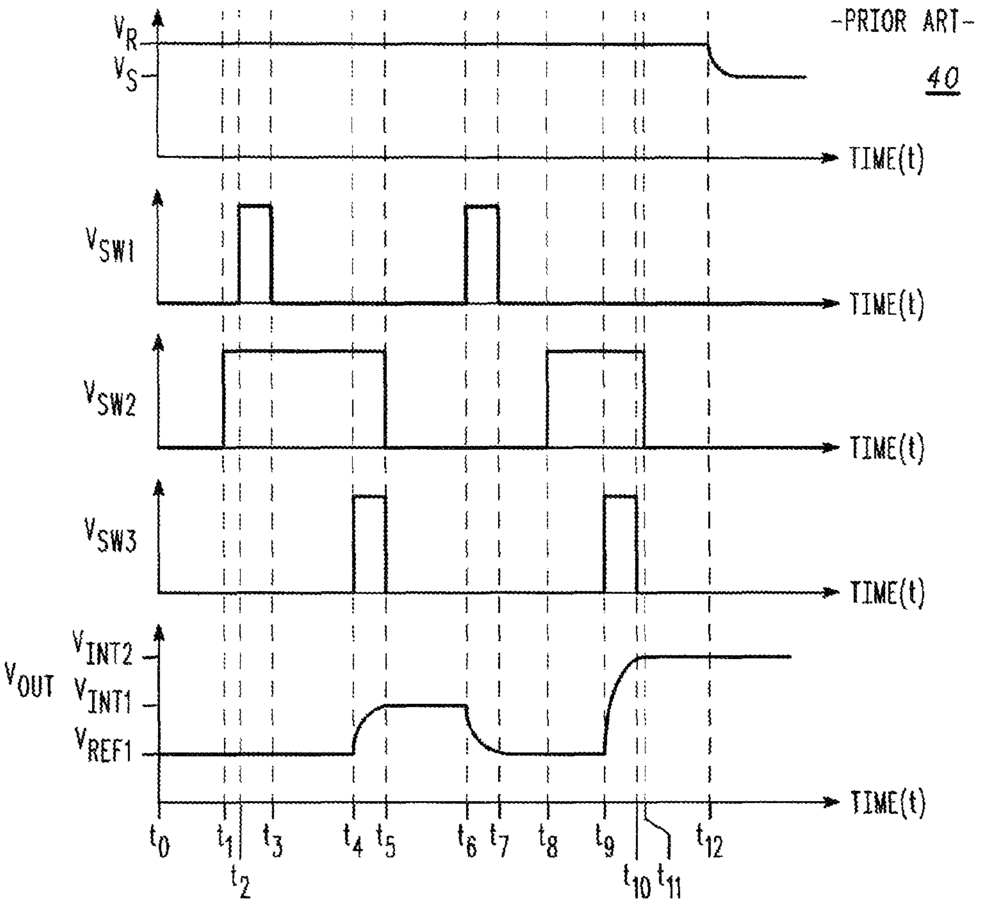

170

FIG. 7
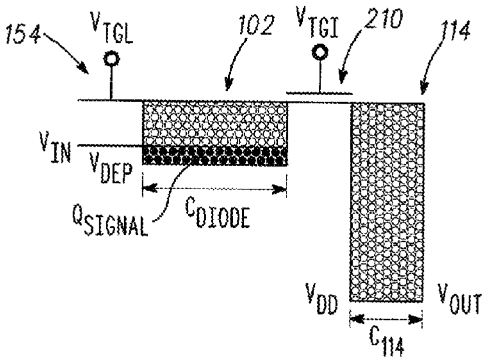
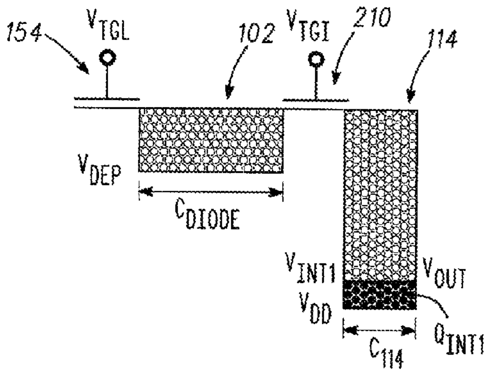
FIG. 8
FIG. 9
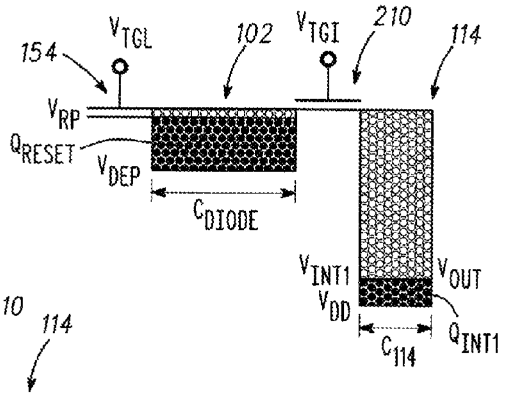
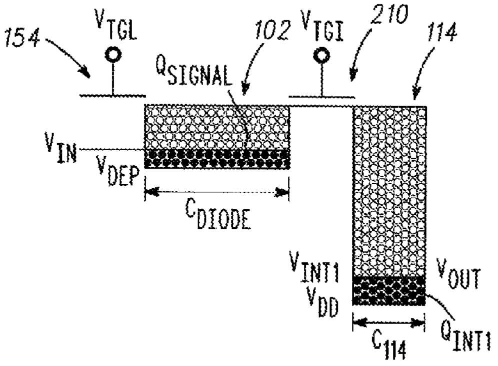
FIG. 10

250

270

PASSIVE INTEGRATOR AND METHOD

BACKGROUND

The present invention relates, in general, to electronics and, more particularly, to integrators and methods to integrate signals.

In the past, the electronics industry used active circuits to perform signal integration. The active circuits consumed significant power and introduced noise components into the integrated signal. Typically the active circuit included an operational amplifier in a closed loop negative feedback configuration. FIG. 1 is a circuit schematic of a prior art integrator 10. What is shown in FIG. 1 is an operational amplifier 12 in a negative feedback configuration. Operational amplifier 12 has a noninverting input terminal coupled for receiving a reference voltage $V_{REF1}$ and an inverting input terminal connected to a capacitor 14, which is coupled for receiving an input signal $V_{IN}$ through a switch 16. In addition, the inverting input terminal is connected to an output terminal 26 of operational amplifier 12 through a switch 18 and through a switch 20 and a capacitor 22. Switches 16 and 18 have control terminals that are coupled for receiving a control signal $V_{SW1}$ and switch 20 has a control terminal coupled for receiving a control signal $V_{SW2}$. Switch 16 and capacitor 14 have terminals that are commonly connected together and to a terminal of a switch 24. In addition, switch 24 has a terminal coupled for receiving a reference voltage $V_{REF2}$ and a control terminal coupled for receiving a control signal $V_{SW3}$.

A load capacitor 28 is coupled between output terminal 26 and a source of operating potential $V_{SS}$.

The operation of integrator 10 is explained with reference to timing diagram 40 illustrated in FIG. 2. At time $t_0$, control voltages $V_{SW1}$, $V_{SW2}$, and $V_{SW3}$ are at logic low voltage levels and output voltage $V_{OUT}$ is at voltage level $V_{REF1}$. A reset and sampling phase is initiated by applying a voltage $V_{SW2}$ at the control terminal of switch 20 at time $t_1$ and a voltage $V_{SW1}$ at the control terminals of switches 16 and 18 at time $t_2$. More particularly, voltages $V_{SW2}$ and $V_{SW1}$ transition from a logic low voltage level to a logic high voltage level at times $t_1$ and $t_2$, respectively. In response to the logic high voltage, switches 16, 18, and 20 close, operational amplifier 12 enters a unity gain operating mode, and the voltages at the inverting and noninverting input terminals equal reference voltage $V_{REF1}$. Capacitor 14 samples input voltage $V_{IN}$ and is charged to a level $Q_{14S}$. Because integrator 10 is in a unity gain configuration, capacitor 22 is shorted and as a consequence no charge is accumulated. At time $t_3$, control signal $V_{SW1}$ transitions to a logic low voltage level ending the sampling period for capacitor 14.

In response to control signal $V_{SW3}$ transitioning to a logic high voltage level at time $t_4$, switch 24 closes coupling reference voltage $V_{REF2}$ to capacitor 14 and beginning the integration phase. Output voltage $V_{OUT}$ increases from voltage level $V_{REF1}$ to a voltage level $V_{INT1}$. The output voltage $V_{OUT1}$ after one integration step may be given by Equation 1 (EQT 1):

$$V_{OUT1}-(V_{REF1})-(C_{14}/C_{22})*(V_{IN}-V_{REF2}) \qquad \text{EQT 1}$$

where:

$C_{14}$ is the capacitance value of capacitor 14; and $C_{22}$ is the capacitance value of capacitor 22.

At time $t_5$, control voltages $V_{SW2}$ and $V_{SW3}$ transition to a logic low voltage level, opening switches 20 and 24, respectively, and maintaining the charge on capacitor 22.

Another sampling step begins at time $t_6$, at which time control signal $V_{SW1}$ transitions to a logic high voltage level and ends at time $t_7$ at which time control signal $V_{SW1}$ transitions to a logic low voltage level. At time $t_8$ control signal $V_{SW2}$ transitions to a logic high voltage level beginning another integration phase. At time $t_9$ control signal $V_{SW3}$ transitions to a logic high voltage level and output voltage $V_{OUT}$ transitions from voltage level $V_{REF1}$ reaching voltage level $V_{INT2}$ at time $t_{10}$. In addition, control signal $V_{SW3}$ transitions to a logic low voltage level at time $t_{10}$ and control signal $V_{SW2}$ transitions to a logic low voltage level at time $t_{11}$. Thus, FIG. 2 illustrates two integration steps. For N integration steps, where N is an integer, the output voltage $V_{OUTN}$ can be given by Equation 2 (EQT 2):

$$V_{OUTN}-(V_{REF1})-N*(C_{14}/C_{22})*(V_{IN}-V_{REF2}) \qquad \text{EQT 2}$$

A drawback with the integrator architecture of FIG. 1 is that it needs an operational amplifier consisting of multiple active elements that are in continuous operation which increases power consumption and introduces noise components.

Accordingly, it would be advantageous to have an integrator and a method for performing integration with reduced power consumption and improved noise performance. It is desirable for the integrator and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a circuit schematic of a prior art integrator;

FIG. 2 is a timing diagram for the prior art integrator of FIG. 1;

FIG. 7 is an energy band diagram of the passive integrators of FIGS. 3 and 4 during operation in accordance with an embodiment of the present invention;

FIG. 8 is an energy band diagram of the passive integrators of FIGS. 3 and 4 during operation in accordance with an embodiment of the present invention;

FIG. 9 is an energy band diagram of the passive integrators of FIGS. 3 and 4 during operation in accordance with an embodiment of the present invention;

FIG. 10 is an energy band diagram of the passive integrators of FIGS. 3 and 4 during operation in accordance with an embodiment of the present invention;

Figure 3:
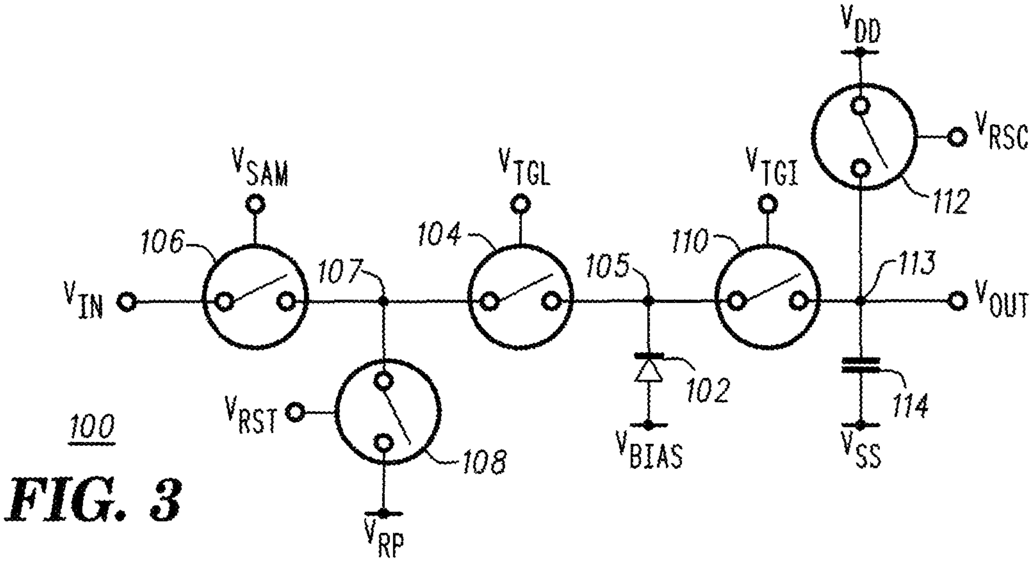
FIG. 3 is a circuit schematic of a passive integrator in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

FIG. 3 is a circuit schematic of a passive integrator 100 in accordance with an embodiment of the present invention. Passive integrator 100 can also be referred to as a passive integrator circuit. Passive integrator 100 includes an n-type diode 102, switches 104, 106, and 108, switches 110 and 112, and a charge storage element 114. Switch 104 has a terminal connected to a terminal of n-type diode 102 forming a node 105, a terminal commonly connected to switches 106 and 108 forming a node 107, and a control terminal coupled for receiving a control signal $V_{TGL}$. Diode 102 has another terminal that is coupled for receiving a source of potential $V_{BIAS}$. Diode 102 may be referred to as a charge storage element or a storage node element. By way of example, diode 102 is engineered to be fully depleted at a voltage $V_{DEP}$. Switch 106 further includes a terminal coupled for receiving an input signal $V_{IN}$ and a control terminal coupled for receiving a control signal $V_{SAM}$ and switch 108 further includes a control terminal coupled for receiving a control signal $V_{RST}$ and a terminal coupled for receiving a reset potential $V_{RP}$.

It should be noted that although diode 102 is shown in schematic form as having two terminals, in a monolithically integrated form the terminals may be comprised of a semiconductor material or a conductor coupled to the semiconductor material. Thus, diode 102 may be monolithically integrated with semiconductor devices such as, for example, transistors that form switches.

Switches 110 and 112 have terminals commonly connected together and to a terminal of charge storage element 114 to form a node 113 at which output signal $V_{OUT}$ appears. In addition, switch 110 has a terminal connected to terminals of switch 104 and diode 102 to form a node 105 and a control terminal coupled for receiving control signal $V_{TGI}$ and switch 112 has a terminal coupled for receiving source of operating potential $V_{DD}$ and a control terminal coupled for receiving control signal $V_{RSC}$. Charge storage element 114 has a terminal coupled for receiving a source of operating potential $V_{SS}$. By way of example, source of operating potential $V_{SS}$ is ground potential. Although charge storage element 114 is shown as a capacitor, this is not a limitation of the present invention. For example, charge storage element 114 can be a diode.

Figure 4:
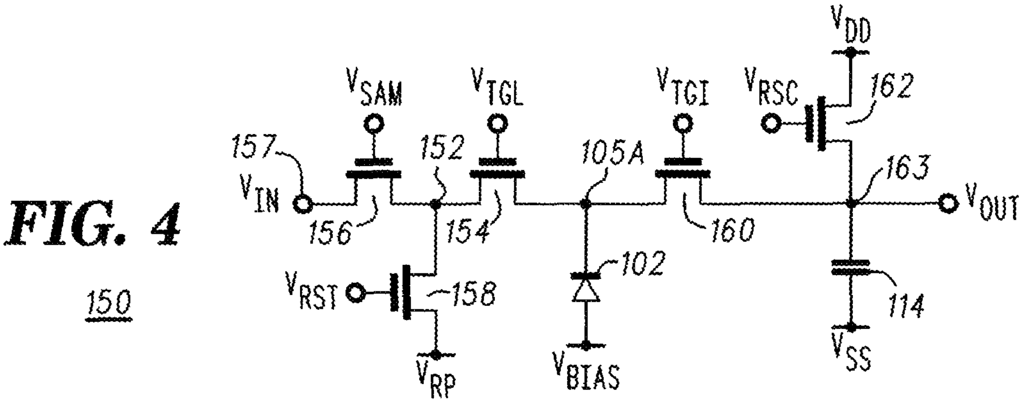
FIG. 4 is a circuit schematic of a passive integrator in accordance with another embodiment of the present invention.

FIG. 4 is a circuit schematic of a passive integrator 150 in accordance with another embodiment of the present invention. Passive integrator 150 is similar to passive integrator 100 except that switches 104, 106, 108, 110, and 112 have been replaced by transistors 154, 156, 158, 160, and 162, respectively. Transistors 154-162 may be re-channel field effect transistors, p-channel field effect transistors, junction field effect transistors, bipolar transistors, or the like. Transistors 154, 156, and 158 have current carrying electrodes that are commonly connected together to form a node 152 and gate electrodes coupled for receiving control signals $V_{TGL}$, $V_{SAM}$, and $V_{RST}$, respectively. Transistor 156 has a current carrying electrode 157 coupled for receiving input voltage $V_{IN}$ and transistor 158 has a current carrying electrode coupled for receiving reset potential $V_{RP}$. Transistors 154 and 160 each have current carrying electrodes commonly connected together and to a terminal of diode 102 to form a node 105A. The other terminal of diode 102 is coupled for receiving source of operating potential $V_{BIAS}$, which may be equal to voltage $V_{SS}$. Transistor 160 has a gate or control electrode coupled for receiving a control signal $V_{TGI}$ and another current carrying electrode that is commonly connected to a current carrying electrode of transistor 162 and to a terminal of charge storage element 114 to form an output node 163. Transistor 162 has another current carrying electrode coupled for receiving source of operating potential $V_{DD}$ and a gate or control electrode coupled for receiving control signal $V_{RSC}$. Like passive integrator 100, the other terminal of charge storage element 114 is coupled for receiving source of operating potential $V_{SS}$.

Figure 6:
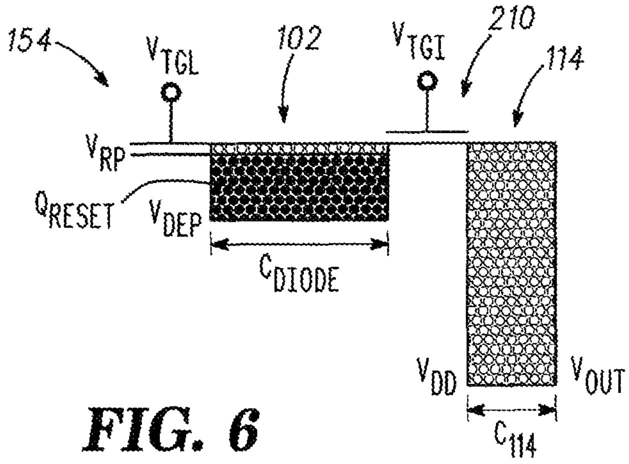
FIG. 6 is an energy band diagram of the passive integrators of FIGS. 3 and 4 during operation in accordance with an embodiment of the present invention.
Figure 5:
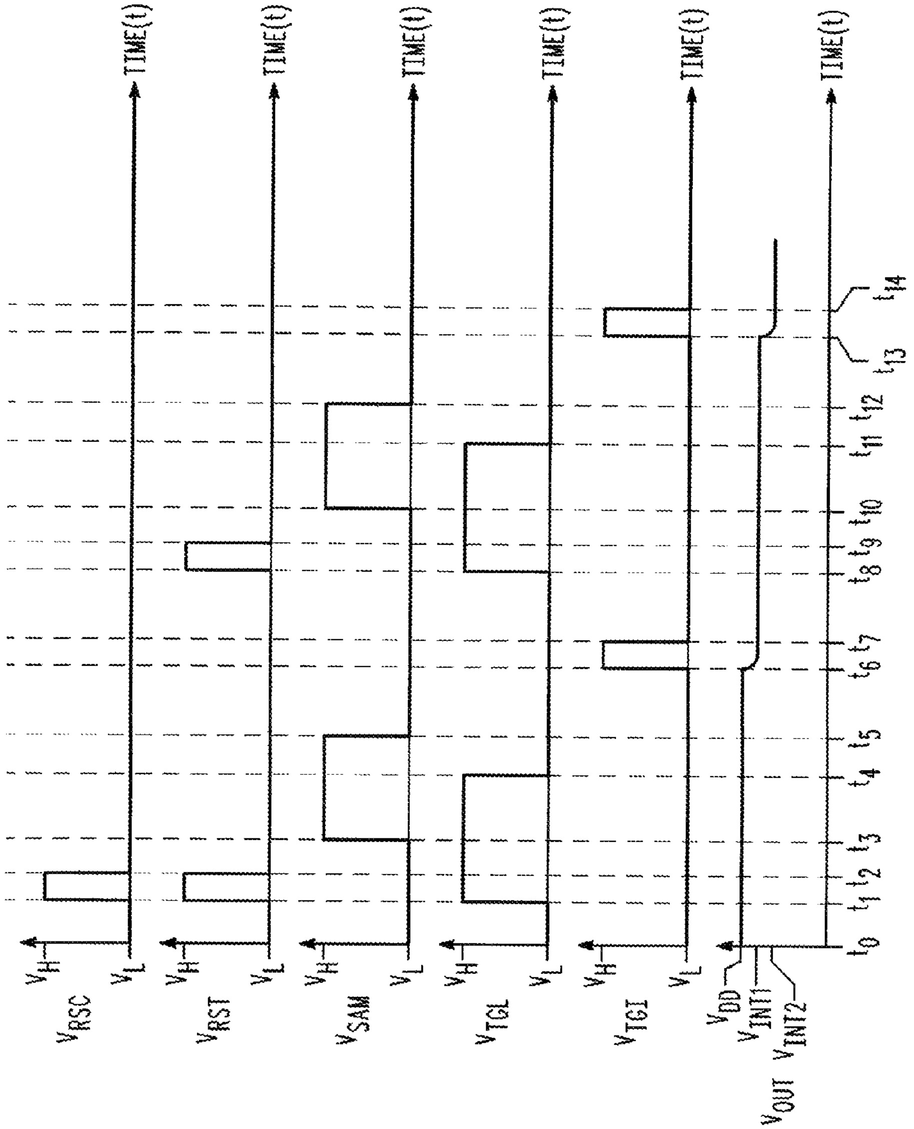
FIG. 5 is a timing diagram for the integrators of FIGS. 3 and 4 in accordance with an embodiment of the present invention.

FIG. 5 is a timing diagram 170 suitable for describing the operation of passive integrator 100 or passive integrator 150. For the sake of clarity, FIG. 5 will be described with reference to passive integrator 150 shown in FIG. 4, however as stated above it is suitable for use in describing the operation of passive integrator 100. In operation, before the integration phase commences, a reset phase occurs, i.e., diode 102 is reset to a voltage that is lower than the lowest voltage level of input voltage $V_{IN}$. At time $t_0$ control signals $V_{RSC}$, $V_{RST}$, $V_{SAM}$, $V_{TGL}$, and $V_{TGI}$ are at logic low voltage levels. By way of example, the reset phase begins in response to control signals $V_{TGL}$, $V_{RST}$, and $V_{RSC}$ transitioning from a logic low voltage level ($V_L$) to a logic high voltage level ($V_H$) at time $t_1$, turning on transistors 154, 158, and 162, respectively. Turning on transistors 154 and 158 resets diode 102, i.e., charges it with electrons until its voltage is substantially equal to voltage $V_{RP}$, which may be referred to as a diode reset voltage level. Turning on transistor 162 resets integration capacitor 114 to a voltage substantially equal to source of operating potential $V_{DD}$ or a voltage that is sufficiently high enough to inhibit charge sharing between integration capacitor 114 and a diode capacitance $C_{DIODE}$ associated with diode 102 after N integration steps, where N is an integer representing the number of expected integration cycles. Briefly referring to FIG. 6, an energy band diagram illustrating the charge stored in diode capacitance $C_{DIODE}$ and the charge stored in integration capacitor 114 between times $t_1$ and $t_3$ is shown. More particularly, the voltage on diode capacitance $C_{DIODE}$ decreases from a voltage substantially equal to voltage $V_{DEP}$ to a voltage substantially equal to voltage $V_{RP}$. The charge ($Q_{RESET}$) accumulated in diode capacitance $_{CDIODE}$ may be given as $(V_{DEP}-V_{RP})*C_{DIODE}$. The voltage on capacitor 114 is substantially equal to voltage $V_{DD}$.

At time $t_2$, control signals $V_{RST}$ and $V_{RSC}$ transition from logic high voltage levels $V_H$ to logic low voltage levels $V_L$ whereas control signal $V_{TGL}$ remains at logic high voltage level $V_H$. Thus, transistors 158 and 162 are turned off but transistor 154 remains on. It should be noted that resetting integration capacitor 114 introduces a reset noise signal, Vnreset, commonly referred to as kTC noise, which is given by equation 3 (EQT 3) as:

$$Vn\text{reset}=(k*T/C_{114})^{1/2} \qquad \text{EQT 3}$$

where k is Boltzmann's constant;

T is temperature in degrees Kelvin; and $C_{114}$ is the capacitance value of integration capacitor 114.

At time $t_3$, control signal $V_{SAM}$ transitions from logic low voltage level $V_L$ to logic high voltage level $V_H$ turning on transistor 156, thereby discharging diode 102 until its voltage substantially equals input voltage $V_{IN}$. Briefly referring to FIG. 7, the voltage across diode 102 is equal to voltage $V_{IN}$ and the charge ($Q_{SIGNAL}$) in the diode capacitance is substantially equal to $C_{DIODE}$ times the difference between voltages $V_{DEP}$ and $V_{IN}$, where $C_{DIODE}$ is the value of the capacitance of diode 102. Integration capacitor 114 remains charged at a voltage level substantially equal to voltage $V_{DD}$ because transistors 160 and 162 are off. It should be noted that FIG. 7 illustrates the charge on diode 102 and integration capacitor 114 substantially between times $t_3$ and $t_4$.

The charge stored by diode 102 is given by equation (EQT) 4 as:

$$Q_{SIGNAL}=C_{DIODE}*(V_{DEP}-V_{IN}) \qquad \text{EQT 4}$$

At time $t_4$, control signal $V_{TGL}$ transitions to logic low voltage level $V_L$ turning off transistor 154 and storing the sampled input voltage signal $V_{IN}$ on capacitance $C_{DIODE}$ of diode 102, i.e., turning off transistor 154 samples an amount of charge corresponding to $Q_{SIGNAL}$ from EQT. 4. This introduces a sampling noise, Vnsample, commonly referred to as kTC noise, which is given by equation (EQT 5) as:

$$Vn\text{sample}=(k*T/C_{DIODE})^{1/2} \qquad \text{EQT 5}$$

where:

k is Boltzmann's constant;

T is temperature in degrees Kelvin; and $C_{DIODE}$ is the capacitance value of diode 102.

At time $t_5$, control signal $V_{SAM}$ transitions to logic low voltage level $V_L$, disconnecting input voltage signal $V_{IN}$ from node 152.

At time $t_6$, control signal $V_{TGI}$ transitions to logic high voltage level $V_H$ beginning the integration phase. The charge stored in diode capacitance $C_{DIODE}$ in response to control signal $V_{TGI}$ transitioning to logic high voltage level $V_H$ is transferred via transistor 160 to integration capacitor 114. Thus, output voltage $V_{OUT}$ transitions from a voltage level $V_{DD}$ to a voltage level $V_{INT1}$. The difference ($V_\Delta$) between the voltage levels of voltages $V_{DD}$ and $V_{INT1}$ is given by equation (EQT) 6 as:

$$V_\Delta=(C_{DIODE}/C_{114})*(V_{DEP}-V_{IN}) \qquad \text{EQT 6}$$

Because the charge in diode capacitance $C_{DIODE}$ is substantially completely transferred, diode 102 is fully depleted and therefore a noise signal is not introduced into the charge stored in integration capacitor 114. At time $t_7$, control signal $V_{TGI}$ transitions to a logic low voltage level substantially concluding the integration phase. The voltage change on capacitor 114 serves as an integrated signal. Briefly referring to FIG. 8, the voltage across capacitor 114 decreases from a voltage level substantially equal to voltage $V_{DD}$ to a voltage level $V_{INT1}$. It should be noted that FIG. 8 illustrates the charge on diode 102 and integration capacitor 114 substantially between times $t_6$ and $t_8$. It should be further noted that the charge stored in diode capacitance $C_{DIODE}$ is transferred to integration capacitor 114 and that the charge ($Q_{INT1}$) stored in integration capacitor 114 is substantially equal to $C_{114}$ times the difference between voltages $V_{DD}$ and $V_{INT1}$.

Control voltages $V_{TGL}$ and $V_{RST}$ transition from logic low voltage level $V_L$ to logic high voltage level $V_H$ turning on transistors 154 and 158, respectively, at time $t_8$. Turning on transistors 154 and 158 resets diode capacitance $C_{DIODE}$. Briefly referring to FIG. 9, an energy band diagram illustrating the charge stored in diode capacitance $C_{DIODE}$ and the charge stored in integration capacitor 114 is shown. As discussed with reference to FIG. 6, the voltage on diode capacitance $C_{DIODE}$ decreases from a voltage substantially equal to voltage $V_{DEP}$ to a voltage substantially equal to voltage $V_{RP}$. The charge ($Q_{RESET}$) accumulated in diode capacitance $C_{DIODE}$ may be given as $(V_{DEP}-V_{RP})*C_{DIODE}$. The voltage stored on integration capacitor 114 remains substantially equal to voltage $V_{INT1}$ because transistors 160 and 162 are off. It should be noted that FIG. 9 illustrates the charge on diode 102 and integration capacitor 114 substantially between times $t_8$ and $t_{10}$.

At time $t_9$, control signal $V_{RST}$ transitions from logic high voltage level $V_H$ to logic low voltage level $V_L$ whereas control signal $V_{TGL}$ remains at a logic high voltage level $V_H$. Thus, transistor 158 is turned off but transistor 154 remains on.

At time $t_{10}$, control signal $V_{SAM}$ transitions from logic low voltage level $V_L$ to logic high voltage level $V_H$ turning on transistor 156 to discharge diode 102 until its voltage substantially equals input voltage $V_{IN}$. Briefly referring to FIG. 10, capacitor 114 remains charged at a voltage level substantially equal to voltage $V_{INT1}$ because transistors 160 and 162 are off. As discussed with reference to FIG. 7, the voltage across diode 102 is equal to voltage $V_{IN}$ and the charge ($Q_{SIGNAL}$) in the diode capacitance is substantially equal to $C_{DIODE}$ times the difference between voltages $V_{DEP}$ and $V_{IN}$, where $C_{DIODE}$ is the value of the capacitance of diode 102. It should be noted that FIG. 10 illustrates the charge on diode 102 and integration capacitor 114 substantially between times $t_{10}$ and $t_{13}$.

At time $t_{11}$, control signal $V_{TGL}$ transitions to logic low voltage level $V_L$ turning off transistor 154 and storing the sampled input voltage signal $V_{IN}$ across diode capacitance $C_{DIODE}$, introducing a noise component described by EQT 5.

At time $t_{12}$, control signal $V_{SAM}$ transitions to logic low voltage level $V_L$, disconnecting input voltage signal $V_{IN}$ from node 152.

Figure 11:
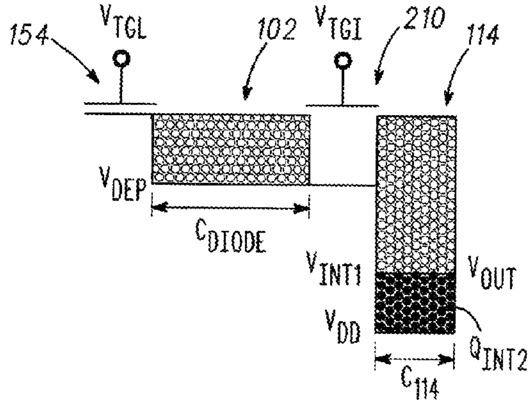
FIG. 11 is an energy band diagram of the passive integrators of FIGS. 3 and 4 during operation in accordance with an embodiment of the present invention.

At time $t_{13}$, control signal $V_{TGI}$ transitions to a logic high voltage level $V_H$ beginning another integration phase. Thus, output voltage $V_{OUT}$ transitions from voltage level $V_{INT1}$ to a voltage level $V_{INT2}$. The difference ($V_\Delta$) between the voltage levels of voltages $V_{INT1}$ and $V_{INT2}$ is given by EQT 5. As discussed above, the charge in diode 102 is substantially completely transferred, thus diode 102 is fully depleted and therefore a noise signal is not introduced into the charge stored in integration capacitor 114. At time $t_{14}$, control signal $V_{TGI}$ transitions to logic low voltage level $V_L$ substantially concluding the integration phase. The voltage change on capacitor 114 serves as an integrated signal. It should be noted that in this portion of the integration process FIG. 11 illustrates the charge on diode 102 and integration capacitor 114 substantially between times $t_{13}$ and $t_{14}$. Briefly referring to FIG. 11, which illustrates the charge on diode 102 and integration capacitor 114 substantially between times $t_{13}$ and $t_{14}$, the voltage across capacitor 114 decreases from a voltage level substantially equal to voltage $V_{INT1}$ to a voltage level $V_{INT2}$. It should be noted that the charge stored in diode capacitance $C_{DIODE}$ is transferred to integration capacitor 114 and that the charge ($Q_{INT2}$) stored in integration capacitor 114 is substantially equal to $C_{114}$ times the difference between voltages $V_{DD}$ and $V_{INT2}$.

Although two integration steps have been shown and described, this is not a limitation of the present invention. There can be more than two integration steps or fewer than two integration steps.

It should be noted that the description of the operation of passive integrator 100 is similar to that of passive integrator 150, wherein control signals $V_{RSC}$, $V_{RST}$, $V_{SAM}$, $V_{TGL}$, and $V_{TGI}$ open and close switches 112, 108, 106, 104, 110, respectively. Turning on a transistor is operationally similar to closing a switch and turning off a transistor is operationally similar to opening a switch.

Figure 12:
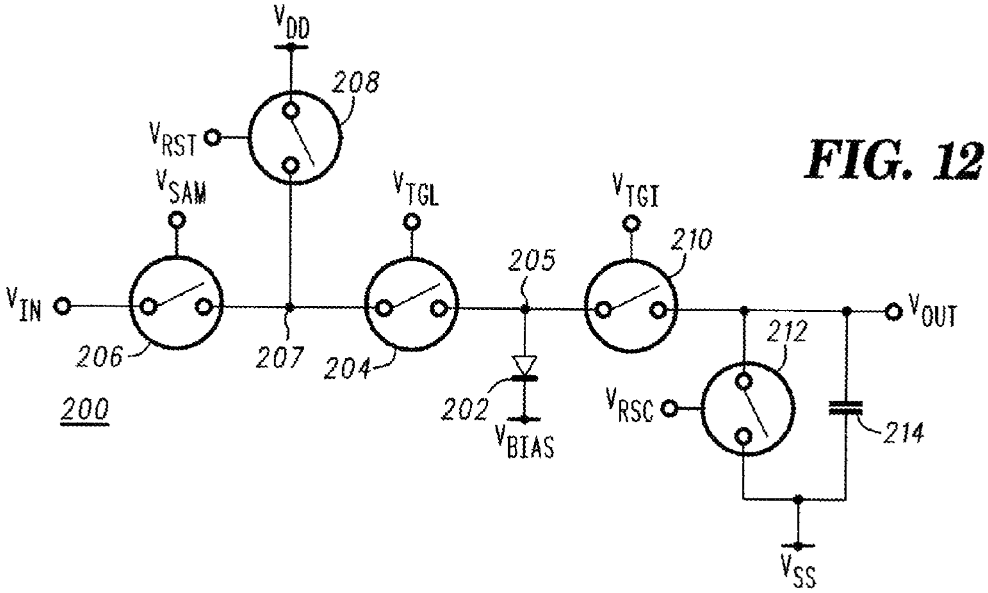
FIG. 12 is a circuit schematic of a passive integrator in accordance with another embodiment of the present invention.

FIG. 12 is a circuit schematic of a passive integrator 200 in accordance with another embodiment of the present invention. Passive integrator 200 can also be referred to as a passive integrator circuit. Passive integrator 200 includes a p-type diode 202, switches 204, 206, and 208, switches 210 and 212, and a charge storage element 214. Switch 204 has a terminal connected to a terminal of diode 202 forming a node 205, a terminal commonly connected to switches 206 and 208 forming a node 207, and a control terminal coupled for receiving a control signal $V_{TGL}$. Diode 202 has another terminal that is coupled for receiving a source of potential $V_{BIAS}$. By way of example, diode 202 may be engineered to be fully depleted at a voltage $(V_{BIAS}-V_{DEP})$. Switch 206 further includes a terminal coupled for receiving an input signal $V_{IN}$ and a control terminal coupled for receiving a control signal $V_{SAM}$ and switch 208 further includes a control terminal coupled for receiving a control signal $V_{RST}$ and a terminal coupled for receiving an operating potential $V_{DD}$. It should be noted that voltage $V_{BIAS}$ can be the bulk potential $V_{DD}$.

It should be noted that although diode 202 is shown in schematic form as having two terminals, in a monolithically integrated form, the terminals may be comprised of a semiconductor material or a conductor coupled to the semiconductor material. Thus, diode 202 may be monolithically integrated with semiconductor devices such as, for example, transistors that form switches. In addition, diode 202 may be referred to as a charge storage element or a storage node element.

Switches 210 and 212 have terminals commonly connected together and to a terminal of charge storage element 214. In addition, switch 210 has a terminal connected to node 205 and a control terminal coupled for receiving control signal $V_{TGI}$ and switch 212 has a terminal coupled for receiving source of operating potential $V_{SS}$ and a control terminal coupled for receiving control signal $V_{RSC}$. Charge storage element 214 has a terminal coupled for receiving source of operating potential $V_{SS}$. Although charge storage element 214 is shown as being a capacitor, this is not a limitation of the present invention. For example, charge storage element 214 can be a diode.

Figure 13:
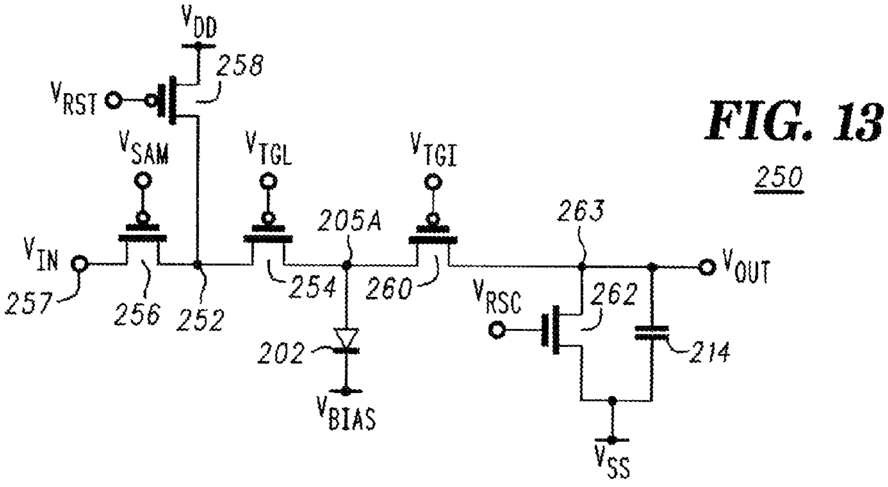
FIG. 13 is a circuit schematic of a passive integrator in accordance with another embodiment of the present invention.

FIG. 13 is a circuit schematic of a passive integrator 250 in accordance with another embodiment of the present invention. Passive integrator 250 is similar to passive integrator 200 except that switches 204, 206, 208, 210, and 212 have been replaced by transistors 254, 256, 258, 260, and 262, respectively. By way of example, transistors 254, 256, 258, 260, and 262 are p-channel transistors. However, it should be understood that transistors 254-262 may be other types of semiconductor devices. Transistors 254, 256, and 258 each have a current carrying electrode commonly connected together to form a node 252 and gate electrodes coupled for receiving control signals $V_{TGL}$, $V_{SAM}$, and $V_{RST}$, respectively. Transistor 256 has a current carrying electrode coupled for receiving input voltage $V_{IN}$ and transistor 258 has a current carrying electrode coupled for receiving source of operating potential $V_{DD}$. Transistors 254 and 260 each have current carrying electrodes commonly connected together and to a terminal of diode 202 to form a node 205A. Diode 202 has another terminal coupled for receiving a source of potential $V_{BIAS}$, which can be equal to voltage $V_{DD}$. Transistor 260 has another current carrying electrode that is commonly connected to a current carrying electrode of transistor 262 and to a terminal of charge storage element 214 to form an output node 263. Transistor 262 has another current carrying electrode coupled for receiving source of operating potential $V_{SS}$ and a gate electrode coupled for receiving control signal $V_{RSC}$. Like passive integrator 200, the other terminal of charge storage element 214 is coupled for receiving source of operating potential $V_{SS}$.

Figure 14:
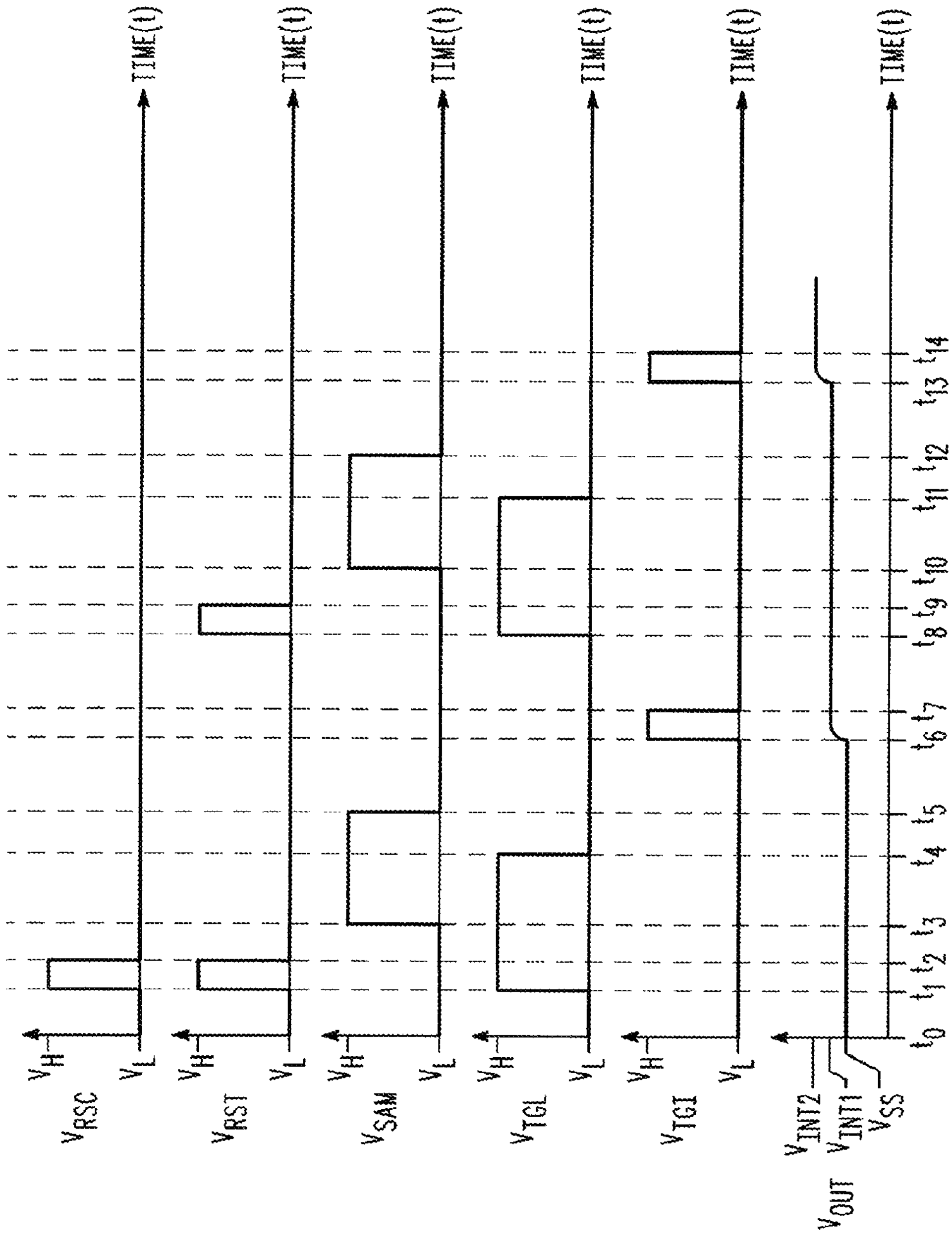
FIG. 14 is a timing diagram for the passive integrators of FIGS. 12 and 13 in accordance with an embodiment of the present invention.
Figure 15:
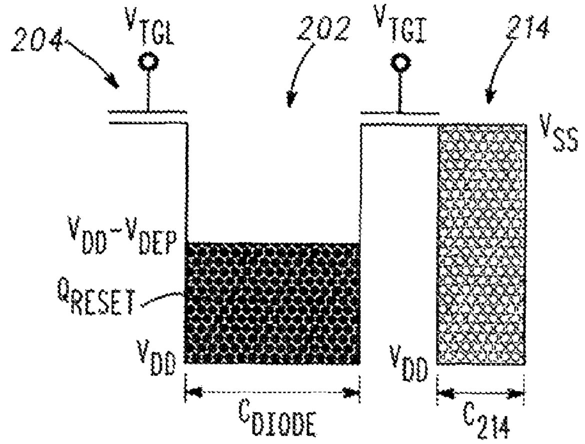
FIG. 15 is an energy band diagram of the passive integrators of FIGS. 12 and 13 during operation in accordance with an embodiment of the present invention.

FIG. 14 is a timing diagram 270 suitable for describing the operation of passive integrator 250 and passive integrator 200. For the sake of clarity, FIG. 14 will be described with reference to passive integrator 250 shown in FIG. 13. In operation, before the integration phase commences, a reset phase occurs, i.e., diode 202 is reset to a voltage that is higher than the highest voltage level of input voltage $V_{INT}$, and has a default value substantially equal to voltage $V_{DD}$. At time $t_0$ control signals $V_{RSC}$, $V_{RST}$, $V_{SAM}$, $V_{TGL}$, and $V_{TGI}$ are at logic low voltage levels. By way of example, the reset phase begins in response to control signals $V_{TGL}$, $V_{RST}$, and $V_{RSC}$ transitioning from a logic low voltage level $V_L$ to a logic high voltage level $V_H$ at time $t_1$, turning on transistors 254, 258, and 262, respectively. Turning on transistors 254 and 258 resets diode 202, i.e., charges it with holes until its voltage substantially equals $V_{DD}$. Turning on transistor 262 resets integration capacitor 214 to a voltage substantially equal to source of operating potential $V_{SS}$. Briefly referring to FIG. 15, an energy band diagram illustrating the charge stored in diode capacitance $C_{DIODE}$ and the charge stored in integration capacitor 214 between times $t_1$ and $t_3$ is shown. More particularly, the voltage on diode capacitance $C_{DIODE}$ increased from a voltage substantially equal to voltage $V_{DD}-V_{DEP}$ to a voltage substantially equal to voltage $V_{DD}$. The voltage on capacitor 214 is substantially equal to voltage $V_{SS}$. The charge in capacitor $C_{214}$ may be given as $V_{SS}*C_{214}$, where $C_{214}$ is the capacitance associated with capacitor 214.

At time $t_2$, control signals $V_{RST}$ and $V_{RSC}$ transition from logic high voltage levels $V_H$ to logic low voltage levels $V_L$ whereas control signal $V_{TGL}$ remains at logic high voltage level $V_H$. Thus, transistors 258 and 262 are turned off but transistor 254 remains on. It should be noted that resetting integration capacitor 214 introduces a reset noise signal, Vnreset, commonly referred to as kTC noise, which is given by EQT 3.

Figure 16:
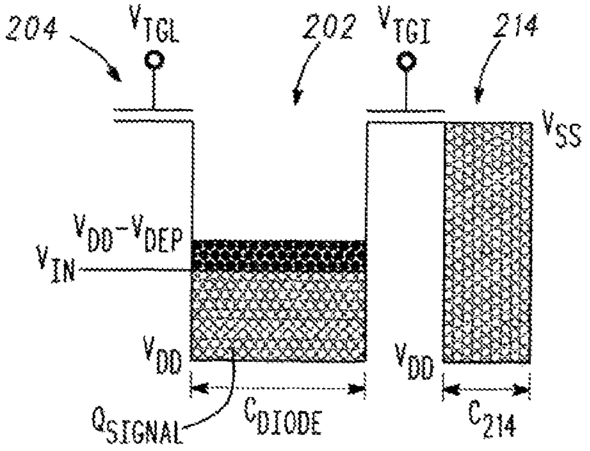
FIG. 16 is an energy band diagram of the passive integrators of FIGS. 12 and 13 during operation in accordance with an embodiment of the present invention.

At time $t_3$, control signal $V_{SAM}$ transitions from logic low voltage level $V_L$ to logic high voltage level $V_H$ turning on transistor 256, thereby discharging holes from diode 202 until its voltage substantially equals input voltage $V_{IN}$. Briefly referring to FIG. 16, the voltage across diode 202 will be forced on current carrying electrode 257 leaving a positive charge residue in diode capacitance $C_{DIODE}$ substantially equal to $C_{DIODE}$ times the difference given by $V_{IN}-(V_{DD}-V_{DEP})$, where $C_{DIODE}$ is the value of the capacitance of diode 202. Integration capacitor 214 remains charged at a voltage level substantially equal to voltage $V_{SS}$ because transistors 260 and 262 are off. The charge stored by diode 202 is given by equation 4. Briefly referring to FIG. 16, the voltage on diode 202 is equal to voltage $V_{IN}$ and the charge ($Q_{SIGNAL}$) in the diode capacitance is substantially equal to $C_{DIODE}$ times the difference between voltages $V_{DD}$ and $V_{IN}$, where $C_{DIODE}$ is the value of the capacitance of diode 202. Integration capacitor 114 remains charged at a voltage level substantially equal to voltage $V_{SS}$ because transistors 260 and 262 are off. It should be noted that FIG. 16 illustrates the charge on diode 202 and integration capacitor 214 substantially between times $t_3$ and $t_4$.

At time $t_4$, control signal $V_{TGL}$ transitions to logic low voltage level $V_L$ turning off transistor 254, storing charge resulting from the sampling input voltage signal $V_{IN}$ on capacitance $C_{DIODE}$ of diode 202 and introducing a kTC noise given by EQT 5.

At time $t_5$, control signal $V_{SAM}$ transitions to logic low voltage level $V_L$, disconnecting input voltage signal $V_{IN}$ from node 252.

At time $t_6$, control signal $V_{TGI}$ transitions to logic high voltage level $V_H$ beginning the integration phase. The charge stored in diode capacitance $C_{DIODE}$ in response to control signal $V_{TGI}$ transitioning to logic high voltage level $V_H$ is transferred via transistor 260 to integration capacitor 214. Thus, output voltage $V_{OUT}$ transitions from a voltage level $V_{SS}$ to a voltage level $V_{INT1}$. The difference ($V_\Delta$) between the voltage levels of voltages $V_{SS}$ and $V_{INT1}$ is given by equation (EQT) 6 as:

$$V_\Delta=(C_{DIODE}/C_{214})*(V_{IN}-(V_{DD}-V_{DEP})) \qquad \text{EQT 6}$$

Figure 17:
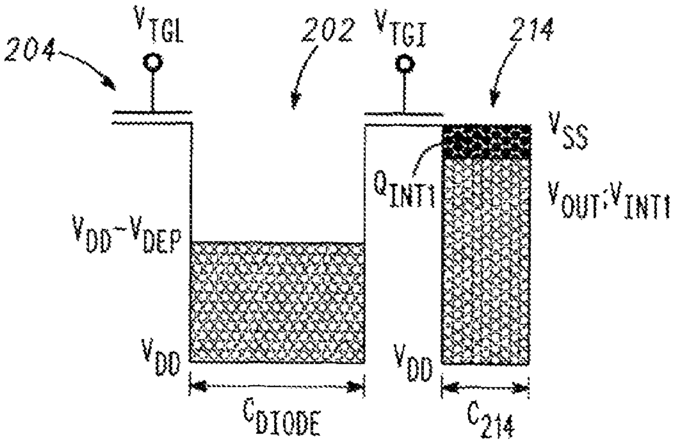
FIG. 17 is an energy band diagram of the passive integrators of FIGS. 12 and 13 during operation in accordance with an embodiment of the present invention.

Because the charge in diode capacitance $C_{DIODE}$ is substantially completely transferred, diode 202 is fully depleted and therefore a noise signal is not introduced during the integration phase. The voltage as a result of the charge stored in capacitor 214 serves as an integrated signal. At time $t_7$, control signal $V_{TGI}$ transitions to a logic low voltage level substantially concluding the integration phase. Briefly referring to FIG. 17, the charge stored in capacitor 214 increases from a voltage level substantially equal to voltage $V_{SS}$ to a voltage level $V_{INT1}$ and the charge in the diode capacitance $C_{DIODE}$ is substantially completely transferred leaving diode capacitance $C_{DIODE}$ fully depleted. It should be noted in this portion of the integration process FIG. 17 illustrates the charge on diode 202 and integration capacitor 214 substantially between times $t_6$ and $t_8$.

Figure 18:
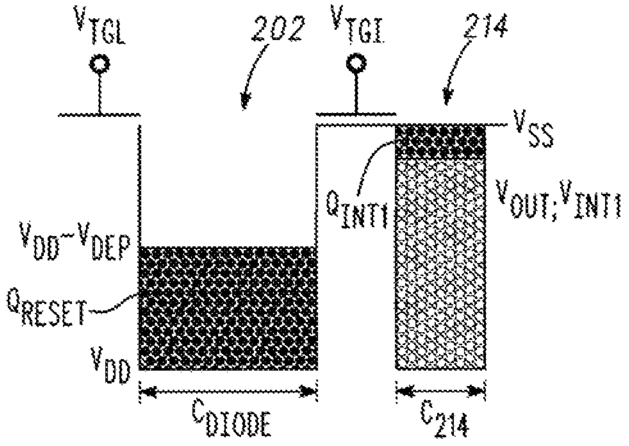
FIG. 18 is an energy band diagram of the passive integrators of FIGS. 12 and 13 during operation in accordance with an embodiment of the present invention.

Control voltages $V_{TGL}$ and $V_{RST}$ transition from logic low voltage level $V_L$ to logic high voltage level $V_H$ turning on transistors 254 and 258, respectively, at time $t_8$. Turning on transistors 254 and 258 resets diode capacitance $C_{DIODE}$ to voltage $V_{DD}$. Briefly referring to FIG. 18, an energy band diagram illustrating the charge stored in diode capacitance $C_{DIODE}$ and the charge stored in integration capacitor 214 is shown between times $t_8$ and $t_{10}$. The voltage stored across integration capacitor 214 remains substantially equal to voltage $V_{INT1}$ because transistors 260 and 262 are off. As described with reference to FIG. 15, the voltage on diode capacitance $C_{DIODE}$ increases from a voltage substantially equal to voltage $V_{DD}-V_{DEP}$ to a voltage substantially equal to voltage $V_{DD}$.

At time $t_9$, control signal $V_{RST}$ transitions from logic high voltage level $V_H$ to logic low voltage level $V_L$ whereas control signal $V_{TGL}$ remains at a logic high voltage level $V_H$. Thus, transistor 258 is turned off but transistor 254 remains on.

Figure 19:
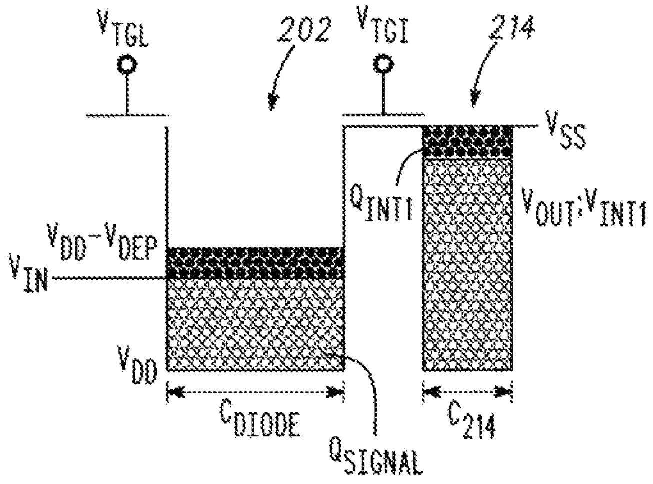
FIG. 19 is an energy band diagram of the passive integrators of FIGS. 12 and 13 during operation in accordance with an embodiment of the present invention.

At time $t_{10}$, control signal $V_{SAM}$ transitions from logic low voltage level $V_L$ to logic high voltage level $V_H$ turning on transistor 256 to sample input voltage signal $V_{IN}$. Briefly referring to FIG. 19, integration capacitor 214 remains charged at a voltage level substantially equal to voltage $V_{INT1}$ because transistors 260 and 262 are off. As discussed with reference to FIG. 16, the voltage on diode 202 is equal to voltage $V_{IN}$ and the charge ($Q_{SIGNAL}$) in the diode capacitance is substantially equal to $C_{DIODE}$ times the difference between voltages $V_{IN}$, $V_{DD}$ , and $V_{DEP}$, where $C_{DIODE}$ is the value of the capacitance of diode 202, i.e., $Q_{SIGNAL}=(V_{IN}-(V_{DD}-V_{DEP}))*C_{DIODE}$. It should be noted that in this portion of the integration process FIG. 19 illustrates the charge on diode 202 and integration capacitor 214 substantially between times $t_{10}$ and $t_{13}$.

At time $t_{11}$, control signal $V_{TGL}$ transitions to logic low voltage level $V_L$ turning off transistor 254, storing the sampled input voltage signal $V_{IN}$ across diode capacitance $C_{DIODE}$, and introducing a kTC noise given by EQT 5.

At time $t_{12}$, control signal $V_{SAM}$ transitions to logic low voltage level $V_L$, disconnecting input voltage signal $V_{IN}$ from node 252.

At time $t_{13}$, control signal $V_{TGI}$ transitions to a logic high voltage level $V_H$ beginning another integration phase. Thus, output voltage $V_{OUT}$ transitions from voltage level $V_{INT1}$ to a voltage level $V_{INT2}$. The difference ($V_\Delta$) between the voltage levels of voltages $V_{INT1}$ and $V_{INT2}$ is given by EQT 6. As discussed above, the charge in diode 202 is substantially completely transferred, thus diode 202 is fully depleted and therefore a noise signal is not introduced into the charge stored in integration capacitor 214. At time $t_{14}$, control signal $V_{TGI}$ transitions to logic low voltage level $V_L$ substantially concluding the integration phase. The charge stored in capacitor 214 serves as an integrated signal.

Figure 20:
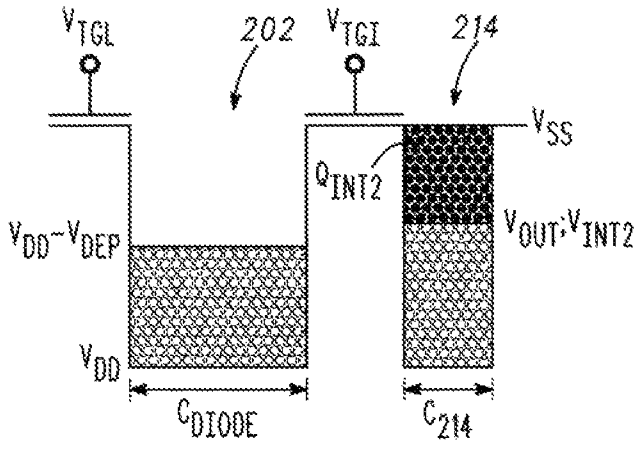
FIG. 20 is an energy band diagram of the passive integrators of FIGS. 12 and 13 during operation in accordance with an embodiment of the present invention.

Briefly referring to FIG. 20, the charge stored in integration capacitor 214 increases from a voltage level substantially equal to voltage $V_{INT1}$ to a voltage level $V_{INT2}$ and the charge in diode capacitance $C_{DIODE}$ is substantially completely transferred leaving diode capacitance $C_{DIODE}$ fully depleted. It should be noted that in this portion of the integration process FIG. 20 illustrates the charge on diode 202 and integration capacitor 214 substantially between times $t_{13}$ and $t_{15}$.

Although two integration steps have been shown and described, this is not a limitation of the present invention. There can be more than two integration steps or fewer than two integration steps.

It should be noted that the description of the operation of passive integrator 200 is similar to that of passive integrator 250, wherein control signals $V_{RSC}$, $V_{RST}$, $V_{SAM}$, $V_{TGL}$, and $V_{TGI}$ open and close switches 212, 208, 206, 204, 210, respectively. As discussed above, turning on a transistor is operationally similar to closing a switch and turning off a transistor is operationally similar to opening a switch.

Figure 21:
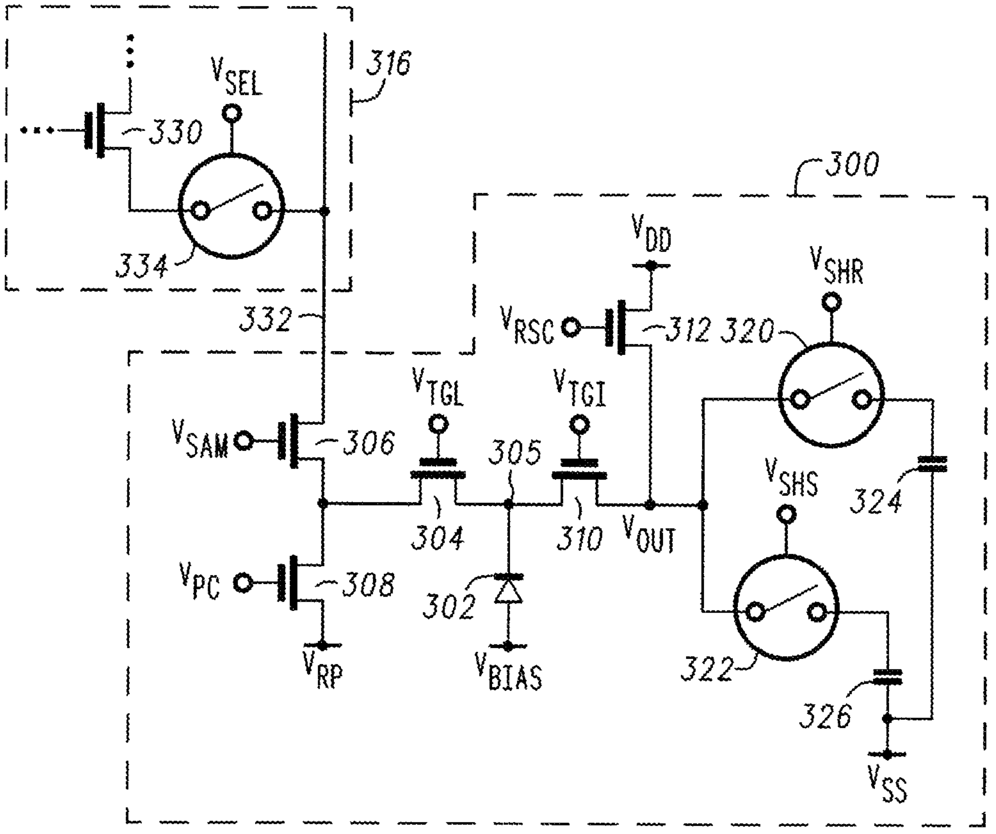
FIG. 21 is a circuit schematic of a passive integrator in accordance with another embodiment of the present invention.

FIG. 21 is a circuit schematic of a passive integrator 300 coupled to a voltage source such as, for example, a portion of a pixel 316 in accordance with an embodiment of the present invention. Passive integrator 300 can also be referred to as a passive integrator circuit. Passive integrator 300 includes a diode 302, transistors 304, 306, 308, 310, and 312. Transistor 304 has a terminal connected to a terminal of diode 302 to form a node 305, a terminal commonly connected to transistors 306 and 308 to form a node 314, and a control terminal coupled for receiving a control signal $V_{TGL}$. Diode 302 has a terminal coupled for receiving a source of potential $V_{BIAS}$. By way of example, diode 302 may be engineered to be fully depleted at a voltage $V_{DEP}$. Transistor 306 further includes a terminal coupled for receiving a signal from a pixel 316 and a control terminal coupled for receiving a control signal $V_{SAM}$ and transistor 308 further includes a control terminal coupled for receiving a control signal $V_{PC}$ and a terminal coupled for receiving a reset potential $V_{RP}$.

It should be noted that although diode 302 is shown in schematic form as having two terminals, in a monolithically integrated form the terminals may be comprised of a semiconductor material or a conductor coupled to the semiconductor material. Thus, diode 302 may be monolithically integrated with semiconductor devices such as, for example, transistors that form switches. In addition, diode 302 may be referred to as a charge storage element or a storage node element.

Transistors 304 and 310 each have current carrying electrodes commonly connected together and to a terminal of diode 302 at node 305. Transistor 310 has another current carrying electrode that is commonly connected to a current carrying electrode of transistor 312 and to terminals of switches 320 and 322. Transistor 312 has another current carrying electrode coupled for receiving source of operating potential $V_{DD}$ and a gate electrode coupled for receiving control signal $V_{RSC}$. An integration capacitor 324 is coupled between switch 320 and source of operating potential $V_{SS}$ and another integration capacitor 326 is coupled between switch 322 and source of operating potential $V_{SS}$. Switch 320 has a control terminal coupled for receiving a control signal $V_{SHR}$ and switch 322 has a control terminal coupled for receiving a control signal $V_{SHS}$.

Transistors 304-312 may be n-channel field effect transistors, p-channel field effect transistors, junction field effect transistors, bipolar transistors, or the like.

It should be noted that a portion of pixel 316 is illustrated in FIG. 21. As those skilled in the art are aware, pixels can have many architectures. For example, the pixel may be a 3T pixel, a 4T pixel, a 5T pixel, etc. Typically, a pixel includes a transistor 330 configured as a source follower, wherein a source of transistor 330 is coupled to a column line 332 through a select switch 334, which may be a transistor.

Figure 22:
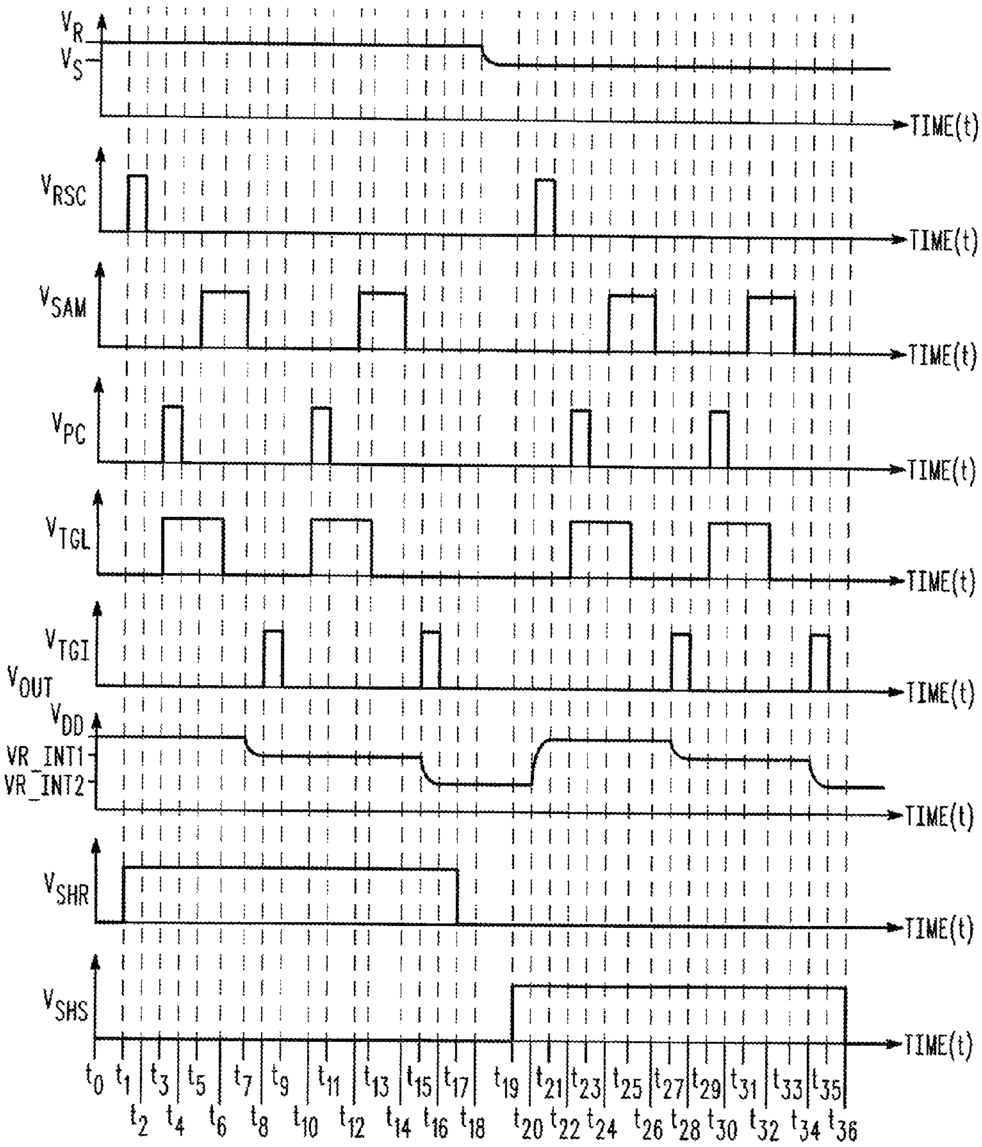
FIG. 22 is a timing diagram for the passive integrator of FIG. 21 in accordance with another embodiment of the present invention.

FIG. 22 is a timing diagram 370 suitable for describing the operation of passive integrator 300. In operation, before a first integration step commences, passive integrator 300 is reset. At time $t_0$ control signals $V_{RSC}$, $V_{SAM}$, $V_{PC}$, $V_{TGL}$, $V_{TGI}$, $V_{SHS}$, and $V_{SHR}$ are at logic low voltage levels. Control signals $V_{RSC}$ and $V_{SHR}$ transition from logic low voltage level $V_L$ to logic high voltage level $V_H$ turning on transistor 312 and closing switch 320, respectively, at time $t_1$, which charges integration capacitor 324 to a voltage substantially equal to source of operating potential $V_{DD}$. It should be noted that resetting integration capacitor 324 introduces a reset noise signal, Vnreset, commonly referred to as kTC noise, which is given by EQT. 3, with the modification that the capacitance value of capacitor 114 is replaced with the capacitance value of capacitor 324.

At time $t_2$, control signal $V_{RSC}$ transitions from logic high voltage level $V_H$ to logic low voltage level $V_L$ while control signal $V_{SHR}$ remains at logic high voltage level $V_H$. Thus, transistor 312 is turned off and switch 320 remains closed.

At time $t_3$, control signals $V_{PC}$ and $V_{TGL}$ transition from logic low voltage level $V_L$ to logic high voltage level $V_H$ turning on transistors 304 and 308 to reset diode 302 to voltage $V_{RP}$. Integration capacitor 324 remains charged at a voltage level substantially equal to voltage $V_{DD}$ because transistor 312 is off and switch 320 is closed.

At time $t_4$, control signal $V_{PC}$ transitions to logic low voltage level $V_L$ turning off transistor 308.

At time $t_5$, control signal $V_{SAM}$ transitions to logic high voltage level $V_H$, connecting the column line output of pixel 316 via node 314 to discharge diode 302 until its voltage substantially equals voltage $V_{IN}$.

At time $t_6$, control signal $V_{TGL}$ transitions to logic low voltage level $V_L$ disconnecting node 314 from diode 302 and sampling the input value on diode 302. This introduces a sampling noise signal which is given by EQT 5.

At time $t_7$, control signal $V_{SAM}$ transitions to logic low voltage level $V_L$ disconnecting pixel 316 from node 314.

At time $t_8$, control signal $V_{TGI}$ transitions to logic high voltage level $V_H$ beginning the integration phase. Thus, output voltage $V_{OUT}$ transitions from a voltage level $V_{DD}$ to a voltage level VR_INT1. At time $t_9$, control signal $V_{TGI}$ transitions to logic low voltage level $V_L$ substantially concluding the integration phase. The voltage across integration capacitor 324 decreases to a voltage level $V_{INT1}$ and the charge from diode 302 is substantially completely transferred to integration capacitor 324. This integration phase is substantially noiseless as described with reference to the integration phases illustrated in FIG. 14, i.e., the description at times $t_6$ to $t_7$ and times $t_{13}$ to $t_{14}$.

Control voltages $V_{TGL}$ and $V_{PC}$ transition from logic low voltage level $V_L$ to logic high voltage level $V_H$ turning on transistors 304 and 308, respectively, at time $t_{10}$. Turning on transistors 304 and 308 resets diode 302. The voltage stored across capacitor 324 remains substantially equal to voltage $V_{INT1}$ because transistors 310 and 312 are off.

At time $t_{11}$, control signal $V_{PC}$ transitions from logic high voltage level $V_H$ to logic low voltage level $V_L$ while control signal $V_{TGL}$ remains at logic high voltage level $V_H$. Thus, transistor 308 is turned off whereas transistor 304 remains on.

At time $t_{12}$, control signal $V_{SAM}$ transitions from logic low voltage level $V_L$ to logic high voltage level $V_H$ turning on transistor 306 to sample the signal from pixel 316, i.e., input voltage signal $V_{IN}$ is transferred to diode 302, which discharges diode capacitance $C_{DIODE}$ to a voltage substantially equal to voltage $V_{IN}$. Integration capacitor 324 remains charged at a voltage level substantially equal to voltage $V_{INT1}$ because transistors 310 and 312 are off.

At time $t_{13}$, control signal $V_{TGL}$ transitions to logic low voltage level $V_L$ turning off transistor 304 and storing the sampled input voltage signal $V_{IN}$ on diode capacitance $C_{DIODE}$.

At time $t_{14}$, control signal $V_{SAM}$ transitions to logic low voltage level $V_L$, disconnecting input voltage signal $V_{IN}$ from node 314.

At time $t_{15}$, control signal $V_{TGI}$ transitions to logic high voltage level $V_H$ beginning another integration phase. Thus, output voltage $V_{OUT}$ transitions from voltage level VR_INT1 to a voltage level VR_INT2. At time $t_{16}$, control signal $V_{TGI}$ transitions to logic low voltage level $V_L$ substantially concluding the integration phase.

At time $t_{17}$, control signal $V_{SHR}$ transitions of logic low voltage level $V_L$ causing switch 320 to open and sample the integrated pixel reset value on capacitor 324. The pixel reset value is sampled first because the pixel noise may be cancelled by applying a correlated double sampling which consists of sampling the reset value, sampling the signal value and afterwards performing a subtraction, which can be performed externally or by on-chip logic circuitry. It should be noted that the kTC noise and other offsets may be cancelled by this subtraction because the reset and signal from the pixel have substantially the same offset. At time $t_{18}$ the pixel signal voltage at column 332 transitions from voltage level $V_R$ to voltage level $V_S$. This is the pixel signal voltage.

Control signal $V_{SHS}$ transitions from logic low voltage level $V_L$ to logic high voltage level $V_H$ closing switch 322 at time $t_{19}$ and at time $t_{20}$, control signal $V_{RSC}$ transitions from logic low voltage level $V_L$ to logic high voltage level $V_H$ while control signal $V_{SHS}$ remains at logic high voltage level $V_H$. Thus, transistor 312 is turned on whereas switch 320 remains closed. This resets integration capacitor 326 to voltage $V_{DD}$. It should be noted that resetting integration capacitor 326 introduces a reset noise signal Vnreset, commonly referred to as kTC noise, which is given by EQT. 3, with the modification that the capacitance value of capacitor 114 is replaced with the capacitance value of capacitor 324.

At time $t_{21}$, control signal $V_{RSC}$ transitions from logic high voltage level $V_H$ to logic low voltage level $V_L$ while control signal $V_{SHS}$ remains at logic high voltage level $V_H$. Thus, transistor 312 is turned off whereas switch 320 remains closed.

At time $t_{22}$, control signals $V_{PC}$ and $V_{TGL}$ transition from logic low voltage level $V_L$ to logic high voltage level $V_H$ turning on transistor 306 to precharge column 332 and reset diode 302 to substantially voltage $V_{SS}$. Integration capacitor 326 remains charged at a voltage level substantially equal to voltage $V_{DD}$ because transistor 312 is off and switch 322 is closed.

At time $t_{23}$, control signal $V_{PC}$ transitions to logic low voltage level $V_L$ turning off transistor 308.

At time $t_{24}$, control signal $V_{SAM}$ transitions to logic high voltage level $V_H$ connecting pixel 316, i.e., input voltage $V_{IN}$, via node 324 to discharge diode 302 until its voltage substantially equals voltage $V_{IN}$.

At time $t_{25}$, control signal $V_{TGL}$ transitions to logic low voltage level $V_L$ sampling voltage $V_{IN}$ on diode 302. At time $t_{26}$, control signal $V_{SAM}$ transitions to logic low voltage level $V_L$ disconnecting pixel output 332 from node 314.

At time $t_{27}$, control signal $_{VTGI}$ transitions to logic high voltage level $V_H$ beginning the signal integration phase. The voltage on integration capacitor 326 decreases to a voltage level VS_INT1.

At time $t_{28}$, control signal $_{VTGI}$ transitions to logic low voltage level $V_L$ completing the signal integration phase.

At time $t_{29}$, control voltages $V_{TGL}$ and $V_{PC}$ transition from logic low voltage level $V_L$ to logic high voltage level $V_H$ turning on transistors 304 and 308, respectively. Turning on transistors 304 and 308 resets diode 302. The voltage stored across integration capacitor 326 remains substantially equal to voltage $V_{SINT1}$ because transistors 310 and 312 are off.

At time $t_{30}$, control signal $V_{PC}$ transitions from logic high voltage level $V_H$ to logic low voltage level $V_L$ while control signal $V_{TGL}$ remains at logic high voltage level $V_H$. Thus, transistor 308 is turned off whereas transistor 304 remains on.

At time $t_{31}$, control signal $V_{SAM}$ transitions from logic low voltage level $V_L$ to logic high voltage level $V_H$ turning on transistor 306 to discharge diode 302 until its voltage is substantially equal to voltage $V_{IN}$. Integration capacitor 326 remains charged at a voltage level substantially equal to voltage $V_{SINT1}$ because transistors 310 and 312 are off.

At time $t_{32}$, control signal $V_{TGL}$ transitions to logic low voltage level $V_L$ turning off transistor 304 and effectively sampling input voltage $V_{IN}$ on diode 302.

At time $t_{33}$, control signal $V_{SAM}$ transitions to logic low voltage level $V_L$, disconnecting input voltage signal $V_{IN}$ from node 314.

At time $t_{34}$, control signal $V_{TGI}$ transitions to logic high voltage level $V_H$ beginning another integration phase. Thus, output voltage $V_{OUT}$ transitions from voltage level $V_{SINT1}$ to a voltage level $V_{SINT2}$. The charge stored in diode 302 is substantially completely transferred making the transfer substantially noiseless and leaving diode 302 in a fully depleted state. At time $t_{35}$, control signal $V_{TGI}$ transitions to logic low voltage level $V_L$ substantially concluding the integration phase.

At time $t_{36}$, control signal $V_{SHS}$ transitions to logic low voltage level $V_L$ causing switch 322 to open effectively sampling the integrated pixel signal value on capacitor 326.

It should be noted that passive integrators in accordance with embodiments of the present invention are not limited to passive integrators used in image sensor circuits. For example, it can be a building block for analog-to-digital converters, gain stages, etc.

Although two integration steps have been shown and described, this is not a limitation of the present invention. There can be more than two integration steps or fewer than two integration steps.

By now it should be appreciated that a passive integrator and method have been provided. In accordance with embodiments, the passive integrator includes two charge storage elements connected to each other via a transistor. In accordance with embodiments in which one charge storage element is a diode and the other charge storage element is a capacitor, the diode and capacitor are reset to predetermined voltage levels, i.e., a predetermined amount of charge is stored in the diode and a predetermined amount of opposite charge is stored in the capacitor. An input signal is sampled on the diode capacitance resulting in a charge residue stored in the diode. The charge residue stored in the diode is transferred to the capacitor to generate an integrated signal in the voltage domain. Resetting the diode, sampling the input voltage, and transferring the charge residue can be repeated N times, where N is the number of integration steps.

Although specific embodiments have been disclosed herein, it is not intended that the invention be limited to the disclosed embodiments. Those skilled in the art will recognize that modifications and variations can be made without departing from the spirit of the invention. For example, the present invention is not limited to embodiments including pixels. It is intended that the invention encompass all such modifications and variations as fall within the scope of the appended claims.

What is claimed is:

1. A passive integrator comprising:

a first switch having a control terminal and first and second terminals, the first terminal coupled for receiving a first source of potential;

a first diode that fully depletes of charge at an operating voltage, the first diode having a first terminal directly coupled to the second terminal of the first switch;

a second switch having a control terminal and first and second terminals, the first terminal of the second switch directly coupled to the first terminal of the first diode and to the second terminal of the first switch; and a second charge storage element having first and second terminals, the first terminal of the second charge storage element coupled to the second terminal of the second switch; and a third switch having a control terminal and first and second terminals, the first terminal coupled for receiving a first source of operating potential and the second terminal commonly coupled to the first terminal of the second charge storage element and to the second terminal of the second switch.

2. The passive integrator of claim 1, wherein the first diode is an n-type diode.

3. The passive integrator of claim 1, wherein the first diode is a p-type diode.

4. The passive integrator of claim 1, wherein the second charge storage element is a capacitor.

5. The passive integrator of claim 1, further comprising a fourth switch having a control terminal and first and second terminals, the first terminal coupled to the second terminal of the third switch.

6. The passive integrator of claim 5, further comprising a fifth switch having a control terminal and first and second terminals, the first terminal of the fifth switch coupled to the first terminal of the second charge storage element.

7. A method for integrating a signal, comprising:

resetting first and second charge storage elements, wherein resetting the first charge storage element comprises applying a first potential to the first charge storage element and resetting the second charge storage element comprises applying a second potential to the second charge storage element; and wherein applying the second potential to the second charge storage element includes turning on a transistor, wherein the transistor has a control electrode and first and second current carrying electrodes, the first current carrying electrode coupled to the second charge storage element and the second current carrying electrode coupled for receiving a first source of operating potential; and one of turning off another transistor or leaving the another transistor off, wherein the another transistor has a control electrode, a first current carrying electrode coupled to the first charge storage element, and a second current carrying electrode coupled to the second charge storage element;

storing charge in the first charge storage element in response to a sampled input signal; and generating an integrated signal in the second charge storage element.

8. The method of claim 7, wherein applying the first potential to the first charge storage element includes turning on first and second transistors, wherein:

the first transistor has a control electrode and first and second current carrying electrodes, the first current carrying electrode coupled to the first charge storage element; and the second transistor has a control electrode and first and second current carrying electrodes, the first current carrying electrode of the second transistor coupled to the second current carrying electrode of the first transistor and the second current carrying electrode of the second transistor coupled for receiving a first source of potential.

9. The method of claim 8, wherein resetting the second charge storage element comprises applying a second potential to the second charge storage element.

10. The method of claim 8, wherein storing charge in the first charge storage element in response to a sampled input signal includes turning off the second transistor and turning on a fifth transistor, wherein the fifth transistor has a control terminal, a first current carrying terminal coupled for receiving an input signal, and the second current carrying electrode is coupled to the second current carrying electrode of the first transistor.

11. The method of claim 10, wherein generating the integrated signal in the second charge storage element includes turning off the first and fifth transistors and turning on the fourth transistor.

12. The method of claim 7, wherein resetting first and second charge storage elements comprises resetting a diode and a capacitor, respectively.

13. A method for integrating a signal, comprising:

resetting a first charge storage element in response to applying a first potential to the first charge storage element, wherein applying the first potential to the first charge storage element includes turning on first and second transistors, and wherein:

the first transistor has a control electrode and first and second current carrying electrodes, the first current carrying electrode coupled to the first charge storage element; and the second transistor has a control electrode and first and second current carrying electrodes, the first current carrying electrode of the second transistor coupled to the second current carrying electrode of the first transistor and the second current carrying electrode of the second transistor coupled for receiving a first source of potential;

generating an integrated signal in the second charge storage element includes turning off the first and third transistors and turning on a fourth transistor, wherein the fourth transistor has a control electrode, a first current carrying electrode coupled to the first charge storage element, and a second current carrying electrode coupled to the second charge storage element.

14. The passive integrator of claim 6, wherein the first switch comprises a first transistor having a control electrode and first and second current carrying electrodes;

the second switch comprises a second transistor having a control electrode and first and second current carrying electrodes;

the third switch comprises a third transistor having a control electrode and first and second current carrying electrodes;

the fourth switch comprises a fourth transistor having a control electrode and first and second current carrying electrodes; and the fifth switch comprises a fifth transistor having a control electrode and first and second current carrying electrodes.

15. The method of claim 13, wherein storing charge in the first charge storage element in response to the sampled input signal includes turning off the second transistor and turning on a third transistor, wherein the third transistor has a control electrode, a first current carrying electrode coupled for receiving the input signal, and a second current carrying electrode coupled to the second current carrying electrode of the first transistor.

16. The method of claim 13, wherein resetting the first charge storage element comprises resetting a diode.

17. The method of claim 16, wherein generating an integrated signal in the second charge storage element includes generating the integrated signal in a capacitor.

* * * * *